(12) United States Patent
Philipp et al.

(10) Patent No.: US 7,548,448 B2
(45) Date of Patent: Jun. 16, 2009

(54) INTEGRATED CIRCUIT HAVING A SWITCH

(75) Inventors: Jan Boris Philipp, Peekskill, NY (US); Thomas Happ, Tarrytown, NY (US)

(73) Assignee: Infineon Technologies AG, Munich (DE)

( * ) Notice: Subject to any disclaimer, the term of this patent is extended or adjusted under 35 U.S.C. 154(b) by 226 days.

(21) Appl. No.: 11/411,317

(22) Filed: Apr. 26, 2006

(65) Prior Publication Data
US 2007/0047160 A1    Mar. 1, 2007

Related U.S. Application Data

(63) Continuation-in-part of application No. 11/210,372, filed on Aug. 24, 2005.

(51) Int. Cl.
*G11C 11/00* (2006.01)
(52) U.S. Cl. .................. 365/158; 365/171; 365/173
(58) Field of Classification Search ........... 365/158, 365/171, 173
See application file for complete search history.

(56) References Cited

U.S. PATENT DOCUMENTS

| | | | |
|---|---|---|---|
| 5,663,902 A | 9/1997 | Bennett et al. | |
| 6,448,576 B1 | 9/2002 | Davis et al. | |
| 6,477,103 B1 | 11/2002 | Nguyen et al. | |
| 6,692,994 B2 | 2/2004 | Davis et al. | |
| 6,937,507 B2 * | 8/2005 | Chen | 365/163 |
| 6,944,050 B2 | 9/2005 | Kang et al. | |
| 7,042,760 B2 * | 5/2006 | Hwang et al. | 365/163 |
| 7,286,394 B2 * | 10/2007 | Ooishi | 365/158 |
| 7,304,885 B2 * | 12/2007 | Cho et al. | 365/163 |
| 2003/0123207 A1 | 7/2003 | Toyoshima | |
| 2004/0125643 A1 | 7/2004 | Kang et al. | |
| 2004/0140523 A1 | 7/2004 | Hudgens et al. | |
| 2004/0201017 A1 | 10/2004 | Chen | |
| 2005/0047189 A1 | 3/2005 | Thomas et al. | |
| 2005/0151578 A1 | 7/2005 | Huang et al. | |

FOREIGN PATENT DOCUMENTS

| | | |
|---|---|---|
| EP | 0491490 | 6/1992 |
| EP | 0591870 | 4/1994 |
| EP | WO 01/45108 | 6/2001 |

OTHER PUBLICATIONS

"A PROM Element Based on Salicide Agglomeration of Poly Fuses in a CMOS Logic Process"; Mohsen Alavi, et al., 1997. (4 pgs.).

(Continued)

*Primary Examiner*—Son Dinh
*Assistant Examiner*—Nam Nguyen
(74) *Attorney, Agent, or Firm*—Dicke, Billig & Czaja, PLLC

(57) ABSTRACT

A reprogrammable switch includes a first phase-change element, a first reference element, and a second reference element. The switch includes a sense amplifier for outputting a first signal based on a comparison of a signal from the first phase-change element to a signal from the first reference element and for outputting a second signal based on a comparison of the signal from the first phase-change element to a signal from the second reference element.

28 Claims, 9 Drawing Sheets

OTHER PUBLICATIONS

"Dichotomic Current-Mode Serial Sensing Methodology for Multistorage Non-Volatire Memories"; Cristiano Calligaro, et al., 1996. (4 pgs.).

Lai, S., "OUM-A 180 nm Nonvolatile Memory Cell Element Technology For Stand Alone and Embedded Applications," IEDM 2001, 4 pgs., (2001).

Lai, S., "Current Status Of The Phase Change Memory And It's Future," IEDM 2003, 4 pgs., (2003).

Horii, H., "A Novel Cell Technology Using N-doped GeSbTe Films for Phase Change RAM," VLSI, 2003 2 pgs., (2003).

ECD Ovonics, Research Report, Ovonic Unified Memory, http://www.ovonics.com/PDFs/Elec Memory Research Report/OUM.pdf, 1999.

US 6,859,396, 02/2005, Forbes (withdrawn)

* cited by examiner

INTEGRATED CIRCUIT HAVING A SWITCH

CROSS-REFERENCE TO RELATED APPLICATIONS

This application is a continuation-in-part of U.S. patent application Ser. No. 11/210,372, entitled "REPROGRAMMABLE SWITCH USING PHASE CHANGE MATERIAL," filed Aug. 24, 2005, and is incorporated herein by reference.

BACKGROUND

Phase-change materials exhibit at least two different states. The states of phase-change material may be referenced to as amorphous and crystalline states. The states may be distinguished because the amorphous state generally exhibits higher resistivity than does the crystalline state. Generally, the amorphous state involves a more disordered atomic structure, while the crystalline state is an ordered lattice. Some phase-change materials exhibit two crystalline states, e.g. a face-centered cubic (FCC) state and a hexagonal closest packing (HCP) state. These two crystalline states have different resistivities. In the following description, the amorphous state generally refers to the state having the higher resistivity, and the crystalline state generally refers to the state having the lower resistivity.

Phase change in the phase-change materials may be induced reversibly. In this way, the phase-change material may change from the amorphous state to the crystalline state, and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. With any of these methods, controllable heating of the phase-change material causes controllable phase change within the phase-change material.

Phase-change material can store multiple bits of data. Multi-bit storage in phase-change material can be achieved by programming the phase-change material to have intermediate resistance values or states. If the phase-change material is programmed to one of three different resistance levels, 1.5 bits of data per phase-change element can be stored. If the phase-change material is programmed to one of four different resistance levels, two bits of data per phase-change element can be stored, and so on. To program a phase-change material to an intermediate resistance value, the amount of crystalline material coexisting with amorphous material and hence the phase-change element resistance is controlled via a suitable write strategy.

Typically, semiconductor chips, such as memories, use fuses to configure the chip or deactivate failing portions of the chip. There are two types of fuses, laser fuses and e-fuses. Laser fuses are opened with a laser and e-fuses are opened with an electrical pulse. Alternatively, electrical antifuses can be used in place of fuses. Antifuses break down a thin dielectric to provide a current path. These solutions use a significant amount of chip space and are therefore costly to implement. Laser fuses are limited by the laser focus spot size and e-fuses and antifuses are limited by minimum size requirements for reliable operation. In addition, these fuses and antifuses are only one time programmable (OTP).

For these and other reasons, there is a need for the present invention.

SUMMARY

One embodiment of the present invention provides a reprogrammable switch. The reprogrammable switch includes a first phase-change element, a first reference element, and a second reference element. The switch includes a sense amplifier for outputting a first signal based on a comparison of a signal from the first phase-change element to a signal from the first reference element and for outputting a second signal based on a comparison of the signal from the first phase-change element to a signal from the second reference element.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
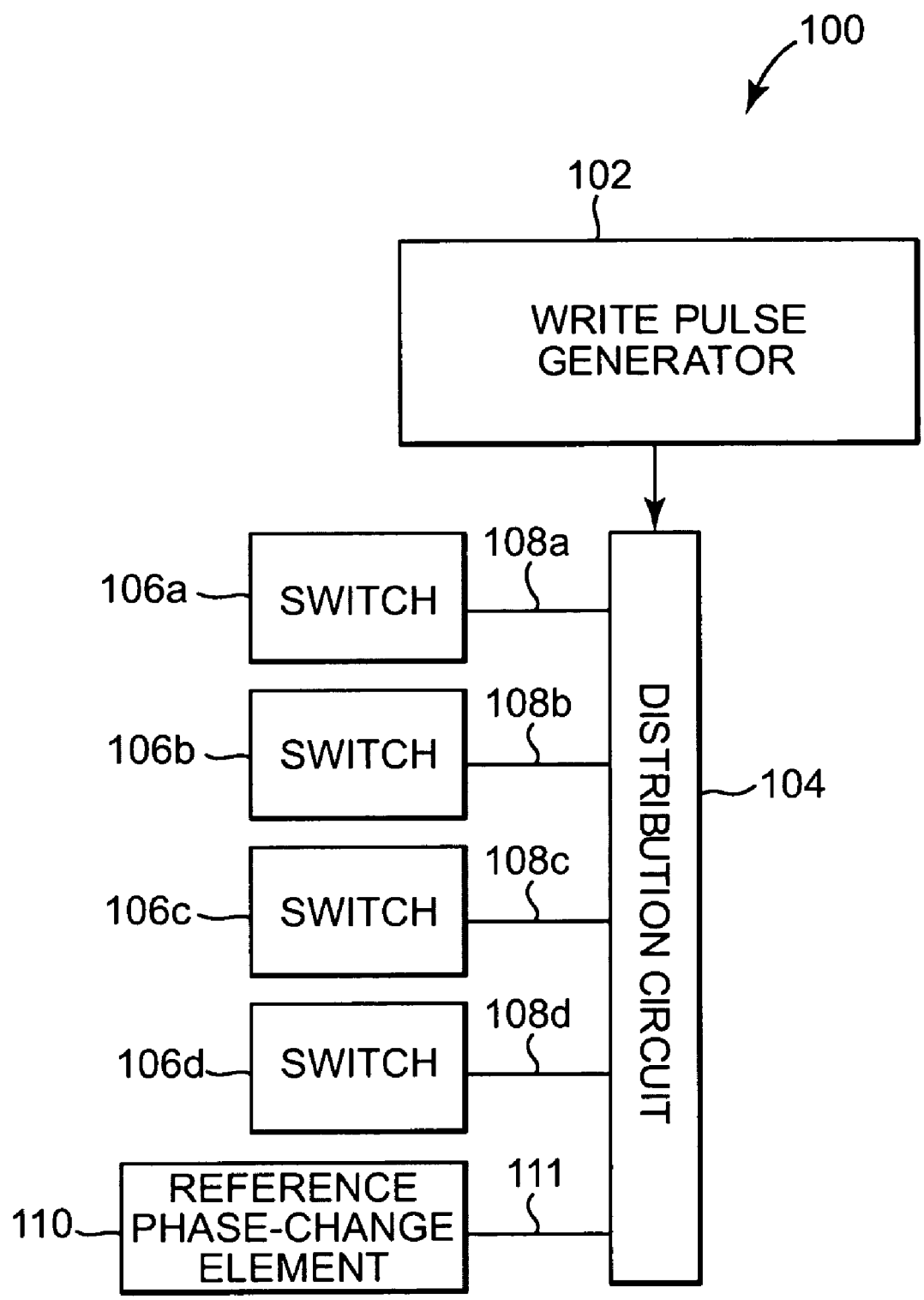
FIG. 1 is block diagram illustrating one embodiment of a device including reprogrammable phase-change material switches.

FIG. 1 illustrates a block diagram of one embodiment of a device 100 including reprogrammable phase-change material switches. Device 100 includes a write pulse generator 102, a distribution circuit 104, reprogrammable switches 106a, 106b, 106c, and 106d, and optional reference phase-change element 110. In one embodiment, reprogrammable switches 106a-106d are phase-change material switches that are based on the amorphous to crystalline phase transition of the phase-change material.

Each reprogrammable switch 106a-106d includes phase-change material. The reprogrammable switches 106a-106d can also be used in place of fuses or antifuses to configure or deactivate part of a chip. The amorphous or crystalline state of the phase-change material of each reprogrammable switch 106a-106d determines whether the switch is open (not conducting) or closed (conducting). In one embodiment, a comparison of the resistance of the phase-change material in each reprogrammable switch 106a-106d with the resistance of reference phase-change element 110 determines whether the switch is open or closed.

In another embodiment, each reprogrammable switch 106a-106d can be programmed into more than two states by programming the phase-change material to have intermediate resistance values. To program one of the reprogrammable switches 106a-106d to an intermediate resistance value, the amount of crystalline material coexisting with amorphous material—and hence the resistance of the phase-change material—is controlled via a suitable write strategy. In this embodiment, each reprogrammable switch 106a-106d can be used in place of multiple fuses or antifuses to configure or deactivate parts of a chip. The resistance value of the phase-change material of each reprogrammable switch 106a-106d determines whether each switch controlled by the reprogrammable switch is open (not conducting) or closed (conducting). In one embodiment, a comparison of the resistance of the phase-change material in each reprogrammable switch 106a-106d with the resistance of reference phase-change element 110 and with the resistance of another reference phase-change element (not shown) determines whether the switches controlled by the reprogrammable switch 106a-106d are open or closed.

In one embodiment, write pulse generator 102 is an internal write pulse generator that is part of the same chip as distribution circuit 104 and reprogrammable switches 106a-106d. In this embodiment, reprogrammable switches 106a-106d can be programmed by write pulse generator 102 at any time throughout the life of the device. In another embodiment, write pulse generator 102 is an external write pulse generator that is not part of the same chip as distribution circuit 104 and reprogrammable switches 106a-106d. In this embodiment, an external write pulse generator 102 is temporarily coupled to distribution circuit 104 to program reprogrammable switches 106a-106d. This allows for programming or configuration of the chip during manufacturing that cannot be changed later by the user. Such one-time programming can be used for additional security features such as serial numbers, encryption codes, etc.

In one embodiment, write pulse generator 102 generates current or voltage pulses that are controllably directed to reprogrammable phase-change material switches 106a-106d via distribution circuit 104 to program the reprogrammable phase-change material switches 106a-106d. In one embodiment, distribution circuit 104 includes a plurality of transistors that controllably direct current or voltage pulses to the reprogrammable phase-change material switches through signal paths 108a-108d and to optional reference phase-change element 110 through signal path 111.

In one embodiment, reprogrammable switches 106a-106d and optional reference phase-change element 110 include phase-change material that may be changed from an amorphous state to a crystalline state or from a crystalline state to an amorphous state under influence of temperature change. The degree of crystallinity thereby defines at least two states for opening or closing the switch within device 100. The at least two states can be assigned to the switch "off" and switch "on" states or the fuse "open" and fuse "closed" states. The switch "off" and "on" states or the fuse "open" and "closed" states of reprogrammable phase-change material switches 106a-106d differ significantly in their electrical resistivity. In the amorphous state, a phase-change material exhibits significantly higher resistivity than in the crystalline state.

In one embodiment, the amount of crystalline material coexisting with amorphous material in the phase-change material of each of the reprogrammable switches 106a-106d defines more than two states for opening or closing more than one switch within device 100a. In the amorphous state, a phase-change material exhibits significantly higher resistivity than in the crystalline state. Therefore, the more than two states of reprogrammable switches 106a-106d differ in their electrical resistivity. In one embodiment, the more than two states can be three states and a trinary system can be used, wherein the three states are assigned bit values of "0", "1", and "2". In one embodiment, the more than two states are four states that can be assigned multi-bit values, such as "00", "01", "10", and "11". In other embodiments, the more than two states can be any suitable number of states in the phase-change material of reprogrammable switches 106a-106d.

To program a reprogrammable phase-change material switch 106a-106d within device 100, write pulse generator 102 generates a current or voltage pulse for heating the phase-change material in the target reprogrammable phase-change material switch. In one embodiment, write pulse generator 102 generates an appropriate current or voltage pulse, which is fed into distribution circuit 104 and distributed to the appropriate target reprogrammable phase-change material switch 106a-106d through signal path 108a-108d. The current or voltage pulse amplitude and duration is controlled depending on whether the reprogrammable phase-change material switch is being turned on or off. Generally, a "set" operation of a reprogrammable phase-change material switch is heating the phase-change material of the target reprogrammable phase-change material switch above its crystallization temperature (but below its melting temperature) long enough to achieve the crystalline state or a partially crystalline and partially amorphous state. Generally, a "reset" operation of a reprogrammable phase-change material switch is heating the phase-change material of the target reprogrammable phase-change material switch above its melting temperature, and then quickly quench cooling the phase-change material, thereby achieving the amorphous state or a partially amorphous and partially crystalline state. Reference phase-change element 110 is set and reset similarly to reprogrammable switches 106a-106d through signal path 111.

As used herein, the term "electrically coupled" is not meant to mean that the elements must be directly coupled together and intervening elements may be provided between the "electrically coupled" elements.

Figure 2:
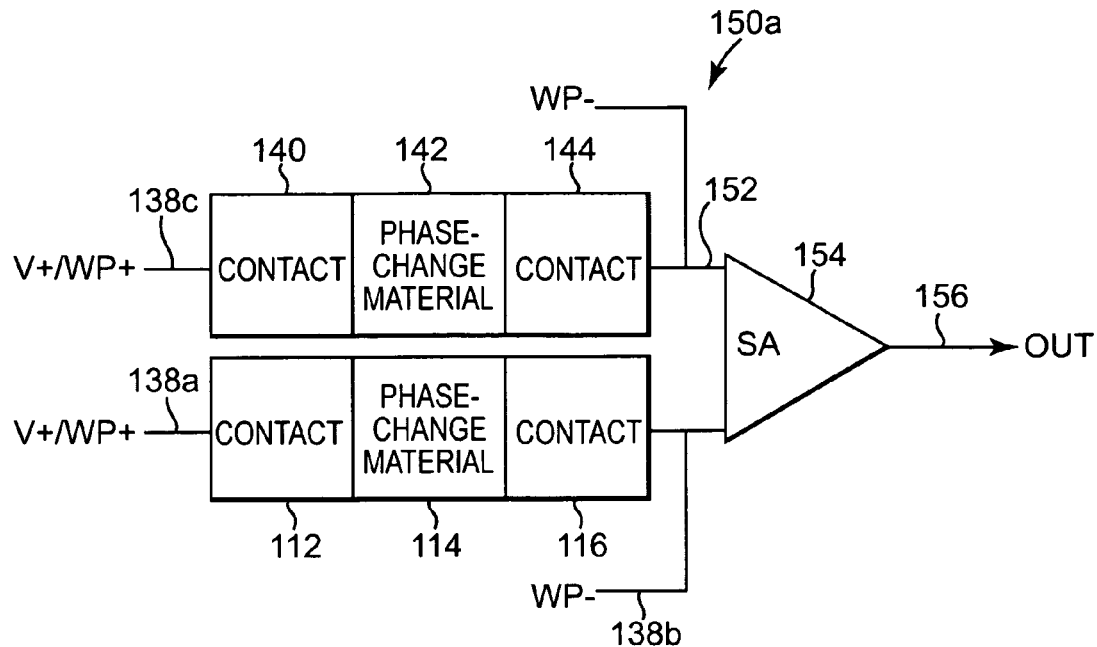
FIG. 2 illustrates one embodiment of a reprogrammable phase-change material switch.

FIG. 2 illustrates one embodiment of a reprogrammable phase-change material switch 150a. Reprogrammable phase-change material switch 150a includes first contact 112, first phase-change material 114, second contact 116, third contact 140, second phase-change material 142, fourth contact 144, and a sense amplifier (SA) 154. First contact 112 receives a constant voltage (V+) or one side of a write pulse (WP+) signal on V+/WP+ signal path 138a. First contact 112 is electrically coupled to first phase-change material 114. First phase-change material 114 is electrically coupled to second contact 116. Second contact 116 is electrically coupled to an input of sense amplifier 154 through the other side of the write pulse (WP−) signal path 138b. Third contact 140 receives a constant voltage (V+) or one side of a write pulse (WP+) signal on V+/WP+ signal path 138c. Third contact 140 is electrically coupled to second phase-change material 142. Second phase-change material 142 is electrically coupled to fourth contact 144. Fourth contact 144 is electrically coupled to another input of sense amplifier 154 through the other side of the write pulse (WP−) signal path 152. Sense amplifier 154 provides the out (OUT) signal on OUT signal path 156.

First phase-change material 114 and second phase-change material 142 may be made up of a variety of materials in accordance with the present invention. Generally, chalcogenide alloys that contain one or more elements from group VI of the periodic table are useful as such materials. In one embodiment, first phase-change material 114 and second phase-change material 142 of reprogrammable phase-change material switch 150a are made up of a chalcogenide compound material, such as GeSbTe, SbTe, GeTe, or AgInSbTe. In another embodiment, the phase-change material can be chalcogen free, such as GeSb, GaSb, InSb, or GeGaInSb. In other embodiments, the phase-change material is made up of any suitable material including one or more of the elements Ge, Sb, Te, Ga, As, In, Se, and S.

During programming of first phase-change material 114 of reprogrammable phase-change material switch 150a, write pulse generator 102 is selectively coupled across first contact 112 and second contact 116. Write pulse generator 102 controls the application of a current and/or voltage write pulse from first contact 112 through V+/WP+ signal path 138a to second contact 116 through WP– signal path 138b, and thus to first phase-change material 114, to set or reset first phase-change material 114. During a set operation of first phase-change material 114, a set current and/or voltage pulse is selectively enabled by write pulse generator 102 and sent through first contact 112 to first phase-change material 114 thereby heating first phase-change material 114 above its crystallization temperature (but usually below its melting temperature). In this way, first phase-change material 114 reaches its crystalline state during this set operation. During a reset operation of first phase-change material 114, a reset current and/or voltage pulse is selectively enabled by write pulse generator 102 and sent through first contact 112 to first phase-change material 114. The reset current or voltage quickly heats first phase-change material 114 above its melting temperature. After the current and/or voltage pulse is turned off, first phase-change material 114 quickly quench cools into the amorphous state.

During programming of second phase-change material 142 of reprogrammable phase-change material switch 150a, write pulse generator 102 is selectively coupled across third contact 140 and fourth contact 144. Write pulse generator 102 controls the application of a current and/or voltage write pulse from third contact 140 through V+/WP+ signal path 138c to fourth contact 144 through WP– signal path 152, and thus to second phase-change material 142, to set or reset second phase-change material 142. During a set operation of second phase-change material 142, a set current and/or voltage pulse is selectively enabled by write pulse generator 102 and sent through third contact 140 to second phase-change material 142 thereby heating second phase-change material 142 above its crystallization temperature (but usually below its melting temperature). In this way, second phase-change material 142 reaches its crystalline state during this set operation. During a reset operation of second phase-change material 142, a reset current and/or voltage pulse is selectively enabled by write pulse generator 102 and sent through third contact 140 to second phase-change material 142. The reset current or voltage quickly heats second phase-change material 142 above its melting temperature. After the current and/or voltage pulse is turned off, second phase-change material 142 quickly quench cools into the amorphous state.

In one embodiment, second phase-change material 142 provides a fixed reference, such as reference phase-change element 110, to compare to first phase-change material 114. In one embodiment, second phase-change material 142 is programmed once at device fabrication. In one embodiment, second phase-change material 142 provides a fixed reference for more than one reprogrammable phase-change material switch 150a. During operation of reprogrammable phase-change material switch 150a, the constant voltage V+ is selectively applied to first contact 112 through V+/WP+ signal path 138a and the constant voltage V+ is applied to third contact 140 through V+/WP+ signal path 138c. With the constant voltage V+ applied to first contact 112 and the constant voltage V+ applied to third contact 140, sense amplifier 154 compares the current on signal path 152 to the current on signal path 138b. If first phase-change material 114 is in the amorphous state and second phase-change material 142 is in the crystalline state, or if the resistance of first phase-change material 114 is significantly greater than the resistance of second phase-change material 142, then the current through first phase-change material 114 is small compared to the current through second phase-change material 142. Therefore, the current on signal path 138b is less than the current on signal path 152. In response to the current on signal path 138b being less than the current on signal path 152, sense amplifier 154 outputs a high voltage level signal on OUT signal path 156 turning on reprogrammable phase-change material switch 150a.

If first phase-change material 114 is in the crystalline state and second phase-change material 142 is in the amorphous state, or if the resistance of first phase-change material 114 is significantly less than the resistance of second phase-change material 142, then the current through first phase-change material 114 is large compared to the current through second phase-change material 142. Therefore, the current on signal path 138b is greater than the current on signal path 152. In response to the current on signal path 138b being greater than the current on signal path 152, sense amplifier 154 outputs a low voltage level signal or ground signal on OUT signal path 156 turning off reprogrammable phase-change material switch 150a. In another embodiment, the voltage levels output by sense amplifier 154 based on the states of first phase-change material 114 and second phase-change material 142 are reversed.

Figure 3:
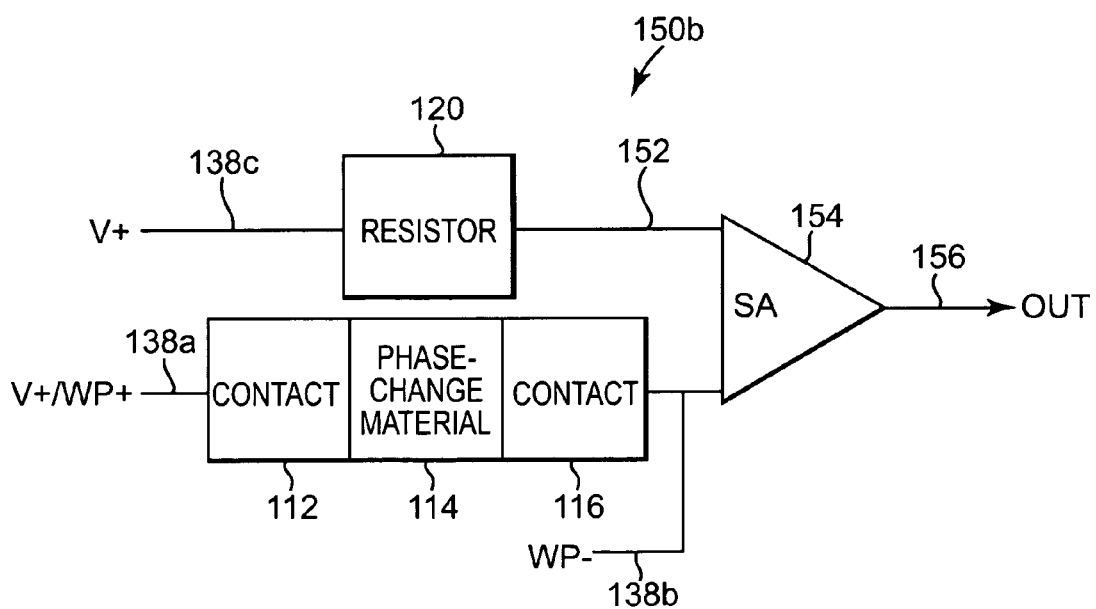
FIG. 3 illustrates another embodiment of a reprogrammable phase-change material switch.

FIG. 3 illustrates another embodiment of a reprogrammable phase-change material switch 150b. Reprogrammable phase-change material switch 150b is similar to reprogrammable phase-change material switch 150a except third contact 140, second phase-change material 142, and fourth contact 144 are replaced by resistor 120, which is a reference element. Resistor 120 receives the constant voltage (V+) on V+ signal path 138c. Resistor 120 is electrically coupled to an input of sense amplifier 154 through signal path 152. First contact 112 receives the constant voltage (V+) or one side of a write pulse (WP+) signal on V+/WP+ signal path 138a. First contact 112 is electrically coupled to phase-change material 114. Phase-change material 114 is electrically coupled to second contact 116. Second contact 116 is electrically coupled to another input of sense amplifier 154 through the other side of the write pulse (WP–) signal path 138b.

During programming of phase-change material 114 of reprogrammable phase-change material switch 150b, write pulse generator 102 is selectively coupled across first contact 112 and second contact 116. Write pulse generator 102 controls the application of a current and/or voltage write pulse from first contact 112 through V+/WP+ signal path 138a to second contact 116 through WP– signal path 138b, and thus to phase-change material 114, to set or reset phase-change material 114. During a set operation of phase-change material 114, a set current and/or voltage pulse is selectively enabled by write pulse generator 102 and sent through first contact 112 to phase-change material 114 thereby heating phase-change material 114 above its crystallization temperature (but usually below its melting temperature). In this way, phase-change material 114 reaches its crystalline state during this set operation. During a reset operation of phase-change material 114, a reset current and/or voltage pulse is selectively enabled by write pulse generator 102 and sent through first contact 112 to phase-change material 114. The reset current or voltage quickly heats phase-change material 114 above its melting temperature. After the current and/or voltage pulse is turned off, phase-change material 114 quickly quench cools into the amorphous state.

In one embodiment, resistor 120 provides a fixed reference to compare to phase-change material 114. In one embodiment, resistor 120 provides a fixed reference for more than one reprogrammable phase-change material switch 150b. During operation of reprogrammable phase-change material switch 150b, the constant voltage V+ is selectively applied to first contact 112 through V+/WP+ signal path 138a and the constant voltage V+ is applied to resistor 120 through V+ signal path 138c. With the constant voltage V+ applied to first contact 112 and the constant voltage V+ applied to resistor 120, sense amplifier 154 compares the current on signal path 152 to the current on signal path 138b. If phase-change material 114 is in the crystalline state, or if the resistance of phase-change material 114 is significantly less than the resistance of resistor 120, then the current through phase-change material 114 is large compared to the current through resistor 120. Therefore, the current on signal path 138b is greater than the current on signal path 152. In response to the current on signal path 138b being greater than the current on signal path 152, sense amplifier 154 outputs a high voltage level signal on OUT signal path 156 turning on reprogrammable phase-change material switch 150b.

If phase-change material 114 is in the amorphous state, or if the resistance of phase-change material 114 is significantly greater than the resistance of resistor 120, then the current through phase-change material 114 is small compared to the current through resistor 120. Therefore, the current on signal path 138b is less than the current on signal path 152. In response to the current on signal path 138b being less than the current on signal path 152, sense amplifier 154 outputs a low voltage level signal or ground signal on OUT signal path 156 turning off reprogrammable phase-change material switch 150b. In another embodiment, the voltage levels output by sense amplifier 154 based on the state of phase-change material 114 and the resistance of resistor 120 are reversed.

Figure 4:
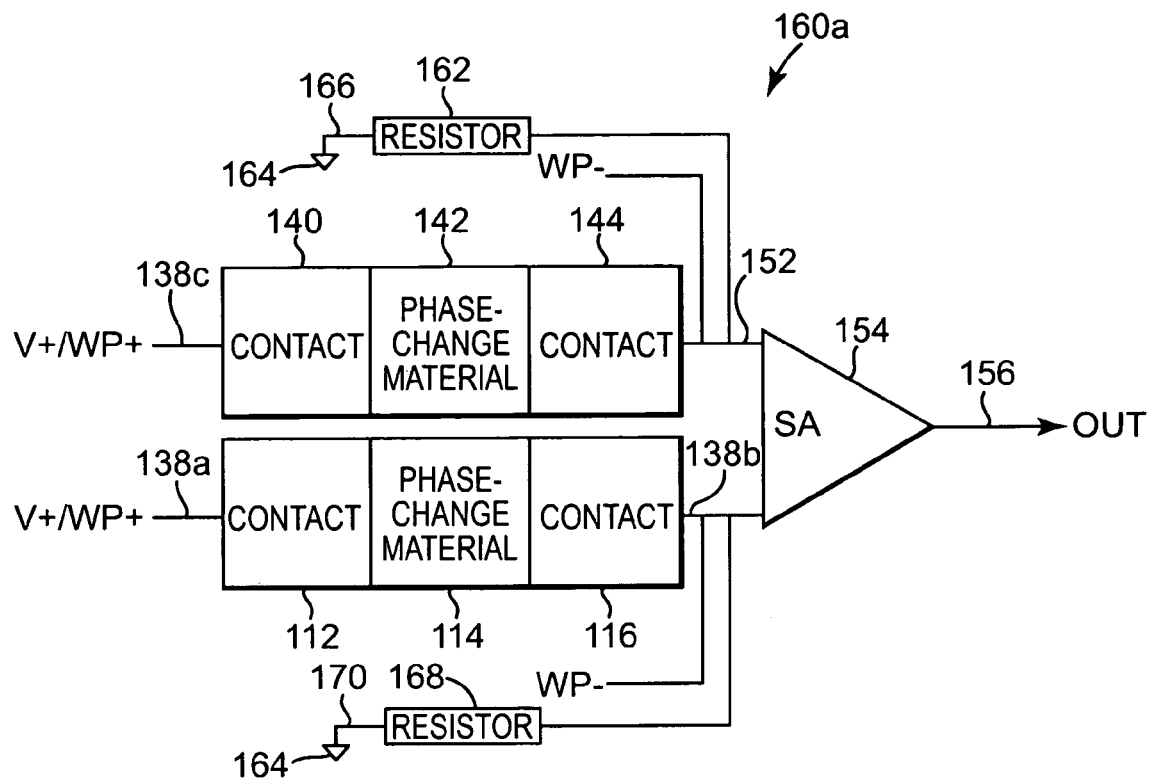
FIG. 4 illustrates another embodiment of a reprogrammable phase-change material switch.

FIG. 4 illustrates another embodiment of a reprogrammable phase-change material switch 160a. Reprogrammable phase-change material switch 160a includes first contact 112, first phase-change material 114, second contact 116, third contact 140, second phase-change material 142, fourth contact 144, resistor 162, resistor 168, and a sense amplifier (SA) 154. In one embodiment, the resistance of resistor 162 is approximately equal to the resistance of resistor 168. First contact 112 receives a constant voltage (V+) or one side of a write pulse (WP+) signal on V+/WP+ signal path 138a. First contact 112 is electrically coupled to first phase-change material 114. First phase-change material 114 is electrically coupled to second contact 116. Second contact 116 is electrically coupled to an input of sense amplifier 154 and one side of resistor 168 through the other side of the write pulse (WP−) signal path 138b. The other side of resistor 168 is electrically coupled to common or ground 164 through signal path 170. Third contact 140 receives a constant voltage (V+) or one side of a write pulse (WP+) signal on V+/WP+ signal path 138c. Third contact 140 is electrically coupled to second phase-change material 142. Second phase-change material 142 is electrically coupled to fourth contact 144. Fourth contact 144 is electrically coupled to another input of sense amplifier 154 and one side of resistor 162 through the other side of write pulse (WP−) signal path 152. The other side of resistor 162 is electrically coupled to common or ground 164 through signal path 166. Sense amplifier 154 provides the out (OUT) signal on OUT signal path 156.

During programming of first phase-change material 114 of reprogrammable phase-change material switch 160a, write pulse generator 102 is selectively coupled across first contact 112 and second contact 116. Write pulse generator 102 controls the application of a current and/or voltage write pulse from first contact 112 through V+/WP+ signal path 138a to second contact 116 through WP− signal path 138b, and thus to first phase-change material 114, to set or reset first phase-change material 114. During a set operation of first phase-change material 114, a set current and/or voltage pulse is selectively enabled by write pulse generator 102 and sent through first contact 112 to first phase-change material 114 thereby heating first phase-change material 114 above its crystallization temperature (but usually below its melting temperature). In this way, first phase-change material 114 reaches its crystalline state during this set operation. During a reset operation of first phase-change material 114, a reset current and/or voltage pulse is selectively enabled by write pulse generator 102 and sent through first contact 112 to first phase-change material 114. The reset current or voltage quickly heats first phase-change material 114 above its melting temperature. After the current and/or voltage pulse is turned off, first phase-change material 114 quickly quench cools into the amorphous state.

During programming of second phase-change material 142 of reprogrammable phase-change material switch 160a, write pulse generator 102 is selectively coupled across third contact 140 and fourth contact 144. Write pulse generator 102 controls the application of a current and/or voltage write pulse from third contact 140 through V+/WP+ signal path 138c to fourth contact 144 through WP− signal path 152, and thus to second phase-change material 142, to set or reset second phase-change material 142. During a set operation of second phase-change material 142, a set current and/or voltage pulse is selectively enabled by write pulse generator 102 and sent through third contact 140 to second phase-change material 142 thereby heating second phase-change material 142 above its crystallization temperature (but usually below its melting temperature). In this way, second phase-change material 142 reaches its crystalline state during this set operation. During a reset operation of second phase-change material 142, a reset current and/or voltage pulse is selectively enabled by write pulse generator 102 and sent through third contact 140 to second phase-change material 142. The reset current or voltage quickly heats second phase-change material 142 above its melting temperature. After the current and/or voltage pulse is turned off, second phase-change material 142 quickly quench cools into the amorphous state.

In one embodiment, second phase-change material 142 provides a fixed reference, such as reference phase-change element 110, to compare to first phase-change material 114. In one embodiment, second phase-change material 142 is programmed once at device fabrication. In one embodiment, second phase-change material 142 provides a fixed reference for more than one reprogrammable phase-change material switch 160a. During operation of reprogrammable phase-change material switch 160a, the constant voltage V+ is selectively applied to first contact 112 through V+/WP+ signal path 138a and the constant voltage V+ is applied to third contact 140 through V+/WP+ signal path 138c. With the constant voltage V+ applied to first contact 112, a voltage divider is formed by first phase-change material 114 and resistor 168. With the constant voltage V+ applied to third contact 140, a voltage divider is formed by second phase-change material 142 and resistor 162. Sense amplifier 154 compares the voltage on signal path 152 to the voltage on signal path 138b. If first phase-change material 114 is in the amorphous state and second phase-change material 142 is in the crystalline state, or if the resistance of first phase-change material 114 is significantly greater than the resistance of second phase-change material 142, then the voltage drop across first phase-change material 114 is large compared to the voltage drop across second phase-change material 142. Therefore, the voltage on signal path 138b is less than the voltage on signal path 152. In response to the voltage on signal path 138b being less than the voltage on signal path 152, sense amplifier 154 outputs a high voltage level signal on OUT signal path 156 turning on reprogrammable phase-change material switch 160a.

If first phase-change material 114 is in the crystalline state and second phase-change material 142 is in the amorphous state, or if the resistance of first phase-change material 114 is significantly less than the resistance of second phase-change material 142, then the voltage drop across first phase-change material 114 is small compared to the voltage drop across second phase-change material 142. Therefore, the voltage on signal path 138b is greater than the voltage on signal path 152. In response to the voltage on signal path 138b being greater than the voltage on signal path 152, sense amplifier 154 outputs a low voltage level signal or ground signal on OUT signal path 156 turning off reprogrammable phase-change material switch 160a. In another embodiment, the voltage levels output by sense amplifier 154 based on the states of first phase-change material 114 and second phase-change material 142 are reversed.

Figure 5:
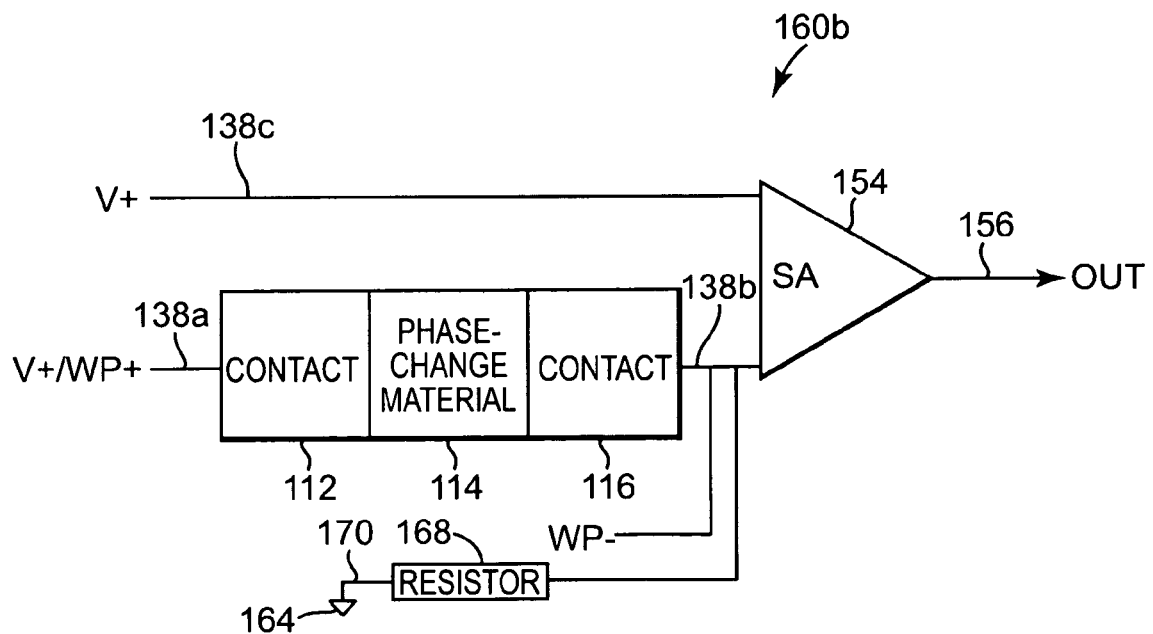
FIG. 5 illustrates another embodiment of a reprogrammable phase-change material switch.

FIG. 5 illustrates another embodiment of a reprogrammable phase-change material switch 160b. Reprogrammable phase-change material switch 160b is similar to reprogrammable phase-change material switch 160a except third contact 140, second phase-change material 142, fourth contact 144, and resistor 162 are removed. An input of sense amplifier 154 receives the constant voltage (V+) on V+ signal path 138c. First contact 112 receives the constant voltage (V+) or one side of a write pulse (WP+) signal on V+/WP+ signal path 138a. First contact 112 is electrically coupled to phase-change material 114. Phase-change material 114 is electrically coupled to second contact 116. Second contact 116 is electrically coupled to another input of sense amplifier 154 and one side of resistor 168 through the other side of the write pulse (WP−) signal path 138b. The other side of resistor 168 is electrically coupled to common or ground 164 through signal path 170.

During programming of phase-change material 114 of reprogrammable phase-change material switch 160b, write pulse generator 102 is selectively coupled across first contact 112 and second contact 116. Write pulse generator 102 controls the application of a current and/or voltage write pulse from first contact 112 through V+/WP+ signal path 138a to second contact 116 through WP− signal path 138b, and thus to phase-change material 114, to set or reset phase-change material 114. During a set operation of phase-change material 114, a set current and/or voltage pulse is selectively enabled by write pulse generator 102 and sent through first contact 112 to phase-change material 114 thereby heating phase-change material 114 above its crystallization temperature (but usually below its melting temperature). In this way, phase-change material 114 reaches its crystalline state during this set operation. During a reset operation of phase-change material 114, a reset current and/or voltage pulse is selectively enabled by write pulse generator 102 and sent through first contact 112 to phase-change material 114. The reset current or voltage quickly heats phase-change material 114 above its melting temperature. After the current and/or voltage pulse is turned off, phase-change material 114 quickly quench cools into the amorphous state.

The constant voltage V+ on signal path 138c provides a fixed reference voltage to compare to the voltage drop across phase-change material 114. During operation of reprogrammable phase-change material switch 160b, the constant voltage V+ is selectively applied to first contact 112 through V+/WP+ signal path 138a and the constant voltage V+ is applied to an input of sense amplifier 154 through signal path 138c. With the constant voltage V+ applied to first contact 112, a voltage divider is formed by first phase-change material 114 and resistor 168. With the constant voltage V+ applied to an input of sense amplifier 154, sense amplifier 154 compares the voltage on signal path 138c to the voltage on signal path 138b. If phase-change material 114 is in the crystalline state, then the voltage drop across phase-change material 114 is small. Therefore, the voltage on signal path 138b is approximately equal to the voltage on signal path 138c. In response to the voltage on signal path 138b being approximately equal to the voltage on signal path 138c, sense amplifier 154 outputs a high voltage level signal on OUT signal path 156 turning on reprogrammable phase-change material switch 160b.

If phase-change material 114 is in the amorphous state, then the voltage drop across phase-change material 114 is large. Therefore, the voltage on signal path 138b is less than the voltage on signal path 138c. In response to the voltage on signal path 138b being less than the voltage on signal path 138c, sense amplifier 154 outputs a low voltage level signal or ground signal on OUT signal path 156 turning off reprogrammable phase-change material switch 160b. In another embodiment, the voltage levels output by sense amplifier 154 based on the state of phase-change material 114 are reversed.

Figure 6:
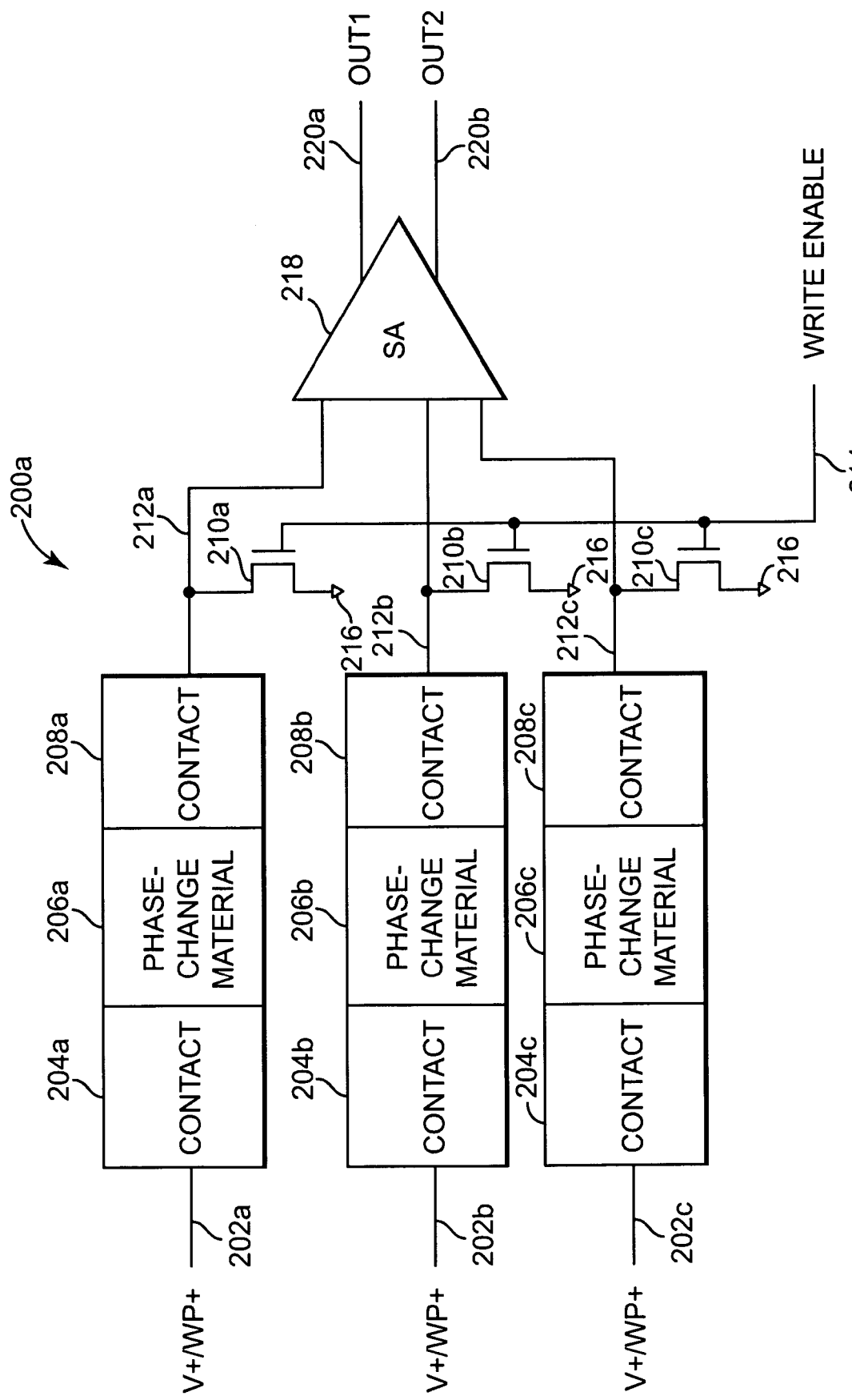
FIG. 6 illustrates another embodiment of a reprogrammable phase-change material switch.

FIG. 6 illustrates another embodiment of a reprogrammable phase-change material switch 200a. Reprogrammable phase-change material switch 200a includes contacts 204a-204c, contacts 208a-208c, first reference phase-change material 206a, second reference phase-change material 206b, phase-change material 206c, transistors 210a-210c, and sense amplifier (SA) 218. Reprogrammable phase-change material switch 200a controls two switch outputs based on the state of phase-change material 206a-206c. Reprogrammable phase-change material switch 200a can provide the following three switch output combinations: "off" and "off"; "on" and "off" or "off" and "on"; and "on" and "on". In other embodiments, more than two switch outputs can be controlled based on the state of phase-change material 206c. In another embodiment, a third reference phase-change material is provided, such that reprogrammable phase-change material switch 200a can provide the following four switch output combinations: "off" and "off"; "on" and "off"; "off" and "on"; and "on" and "on". In other embodiments, any suitable number of reference phase-change material elements and switch outputs are provided to obtain a desired number of switch outputs combinations.

Contact 204a receives a constant voltage (V+) or a write pulse (WP+) signal on V+/WP+ signal path 202a. Contact 204a is electrically coupled to first reference phase-change material 206a. First reference phase-change material 206a is electrically coupled to contact 208a. Contact 208a is electrically coupled to a first input of sense amplifier 218 and one side of the source-drain path of transistor 210a through signal path 212*a*. The other side of the source-drain path of transistor 210*a* is electrically coupled to common or ground 216. The gate of transistor 210*a* receives the write enable signal on write enable signal path 214.

Contact 204*b* receives a constant voltage (V+) or a write pulse (WP+) signal on V+/WP+ signal path 202*b*. Contact 204*b* is electrically coupled to second reference phase-change material 206*b*. Second reference phase-change material 206*b* is electrically coupled to contact 208*b*. Contact 208*b* is electrically coupled to a second input of sense amplifier 218 and one side of the source-drain path of transistor 210*b* through signal path 212*b*. The other side of the source-drain path of transistor 210*b* is electrically coupled to common or ground 216. The gate of transistor 210*b* receives the write enable signal on write enable signal path 214.

Contact 204*c* receives a constant voltage (V+) or a write pulse (WP+) signal on V+/WP+ signal path 202*c*. Contact 204*c* is electrically coupled to phase-change material 206*c*. Phase-change material 206*c* is electrically coupled to contact 208*c*. Contact 208*c* is electrically coupled to a third input of sense amplifier 218 and one side of the source-drain path of transistor 210*c* through signal path 212*c*. The other side of the source-drain path of transistor 210*c* is electrically coupled to common or ground 216. The gate of transistor 210*c* receives the write enable signal on write enable signal path 214. Sense amplifier 218 provides an out one (OUT1) signal on OUT1 signal path 220*a* and an out two (OUT2) signal on OUT2 signal path 220*b*. In one embodiment, transistors 210*a*-210*c* and write enable signal path 214 are replaced with a WP− signal path, such as WP− signal path 152 illustrated in FIG. 4.

During programming of first reference phase-change material 206*a* of reprogrammable phase-change material switch 200*a*, write pulse generator 102 is selectively coupled to contact 204*a*. A logic high write enable signal is applied on write enable signal path 214 to turn on transistor 210*a* to pass a signal between signal path 212*a* and common or ground 216. Write pulse generator 102 controls the application of a current and/or voltage write pulse from contact 204*a* through V+/WP+ signal path 202*a* to contact 208*a* and to common or ground 216 through transistor 210*a*, and thus to first reference phase-change material 206*a*, to program first reference phase-change material 206*a*.

During a set operation of first reference phase-change material 206*a*, a set current and/or voltage pulse is selectively enabled by write pulse generator 102 and sent through contact 204*a* to first reference phase-change material 206*a* thereby heating first reference phase-change material 206*a* above its crystallization temperature (but usually below its melting temperature). In this way, first reference phase-change material 206*a* reaches its crystalline state or a partially crystalline and partially amorphous state during the set operation.

During a reset operation of first reference phase-change material 206*a*, a reset current and/or voltage pulse is selectively enabled by write pulse generator 102 and sent through contact 204*a* to first reference phase-change material 206*a*. The reset current or voltage quickly heats first reference phase-change material 206*a* above its melting temperature. After the current and/or voltage pulse is turned off, first reference phase-change material 206*a* quickly quench cools into the amorphous state or a partially amorphous and partially crystalline state. Phase-change material 206*a* can be programmed to one of three or more resistance values.

During programming of second reference phase-change material 206*b* of reprogrammable phase-change material switch 200*a*, write pulse generator 102 is selectively coupled to contact 204*b*. A logic high write enable signal is applied on write enable signal path 214 to turn on transistor 210*b* to pass a signal between signal path 212*b* and common or ground 216. Write pulse generator 102 controls the application of a current and/or voltage write pulse from contact 204*b* through V+/WP+ signal path 202*b* to contact 208*b* and to common or ground 216 through transistor 210*b*, and thus to second reference phase-change material 206*b*, to program second reference phase-change material 206*b*.

During a set operation of second reference phase-change material 206*b*, a set current and/or voltage pulse is selectively enabled by write pulse generator 102 and sent through contact 204*b* to second reference phase-change material 206*b* thereby heating second reference phase-change material 206*b* above its crystallization temperature (but usually below its melting temperature). In this way, second reference phase-change material 206*b* reaches its crystalline state or a partially crystalline and partially amorphous state during the set operation.

During a reset operation of second reference phase-change material 206*b*, a reset current and/or voltage pulse is selectively enabled by write pulse generator 102 and sent through contact 204*b* to second reference phase-change material 206*b*. The reset current or voltage quickly heats second reference phase-change material 206*b* above its melting temperature. After the current and/or voltage pulse is turned off, second reference phase-change material 206*b* quickly quench cools into the amorphous state or a partially amorphous and partially crystalline state. Second reference phase-change material 206*b* is programmed to a resistance state different from first reference phase-change material 206*a*. Phase-change material 206*b* can be programmed to one of three or more resistance values.

During programming of phase-change material 206*c* of reprogrammable phase-change material switch 200*a*, write pulse generator 102 is selectively coupled to contact 204*c*. A logic high write enable signal is applied on write enable signal path 214 to turn on transistor 210*c* to pass a signal between signal path 212*c* and common or ground 216. Write pulse generator 102 controls the application of a current and/or voltage write pulse from contact 204*c* through V+/WP+ signal path 202*c* to contact 208*c* and to common or ground 216 through transistor 210*c*, and thus to phase-change material 206*c*, to program phase-change material 206*c*.

During a set operation of phase-change material 206*c*, a set current and/or voltage pulse is selectively enabled by write pulse generator 102 and sent through contact 204*c* to phase-change material 206*c* thereby heating phase-change material 206*c* above its crystallization temperature (but usually below its melting temperature). In this way, phase-change material 206*c* reaches its crystalline state or a partially crystalline and partially amorphous state during the set operation.

During a reset operation of phase-change material 206*c*, a reset current and/or voltage pulse is selectively enabled by write pulse generator 102 and sent through contact 204*c* to phase-change material 206*c*. The reset current or voltage quickly heats phase-change material 206*c* above its melting temperature. After the current and/or voltage pulse is turned off, phase-change material 206*c* quickly quench cools into the amorphous state or a partially amorphous and partially crystalline state. Phase-change material 206*c* can be programmed to one of three or more resistance values.

In one embodiment, first reference phase-change material 206*a* and second reference phase-change material 206*b* provide fixed references, such as reference phase-change element 110, to compare to phase-change material 206*c*. In one embodiment, first reference phase-change material 206*a* and second reference phase-change material 206*b* are programmed once at device fabrication. In one embodiment, first reference phase-change material 206a and second reference phase-change material 206b provide fixed references for more than one reprogrammable phase-change material switch 200a by using a suitable distribution circuit. In one embodiment, first reference phase-change material 206a is replaced by a static resistor and/or second reference phase-change material 206b is replaced by a static resistor. In one embodiment, sense amplifier 218 is shared between several reprogrammable phase-change material switches 200a by using a suitable distribution circuit.

During operation of reprogrammable phase-change material switch 200a, the constant voltage V+ is selectively applied to contact 204a through V+/WP+ signal path 202a, contact 202b through V+/WP+ signal path 202b, and contact 202c through V+/WP+ signal path 202c. With the constant voltage V+ applied to contacts 204a, 204b, and 204c, sense amplifier 218 compares the current on signal path 212c to the current on signal path 212a and to the current on signal path 212b. If phase-change material 206c has a resistance greater than the resistance of first reference phase-change material 206a, then the current through phase-change material 206c is less than the current through first reference phase-change material 206a. Therefore, the current on signal path 212c is less than the current on signal path 212a. In response to the current on signal path 212c being less than the current on signal path 212a, sense amplifier 218 outputs a high voltage level signal on OUT1 signal path 220a turning on a first portion of reprogrammable phase-change material switch 200a.

If the resistance of phase-change material 206c is less than the resistance of first reference phase-change material 206a, then the current through phase-change material 206c is greater than the current through first reference phase-change material 206a. Therefore, the current on signal path 212c is greater than the current on signal path 212a. In response to the current on signal path 212c being greater than the current on signal path 212a, sense amplifier 218 outputs a low voltage level signal or ground signal on OUT1 signal path 220a turning off the first portion of reprogrammable phase-change material switch 200a. In another embodiment, the voltage levels output by sense amplifier 218 on OUT1 signal path 220a based on the states of phase-change material 206c and first reference phase-change material 206a are reversed.

If phase-change material 206c has a resistance greater than the resistance of second reference phase-change material 206b, then the current through phase-change material 206c is less than the current through second reference phase-change material 206b. Therefore, the current on signal path 212c is less than the current on signal path 212b. In response to the current on signal path 212c being less than the current on signal path 212b, sense amplifier 218 outputs a high voltage level signal on OUT2 signal path 220b turning on a second portion of reprogrammable phase-change material switch 200a.

If the resistance of phase-change material 206c is less than the resistance of second reference phase-change material 206b, then the current through phase-change material 206c is greater than the current through second reference phase-change material 206b. Therefore, the current on signal path 212c is greater than the current on signal path 212b. In response to the current on signal path 212c being greater than the current on signal path 212b, sense amplifier 218 outputs a low voltage level signal or ground signal on OUT2 signal path 220b turning off the second portion of reprogrammable phase-change material switch 200a. In another embodiment, the voltage levels output by sense amplifier 218 on OUT2 signal path 220b based on the states of phase-change material 206c and second reference phase-change material 206b are reversed.

Figure 7:
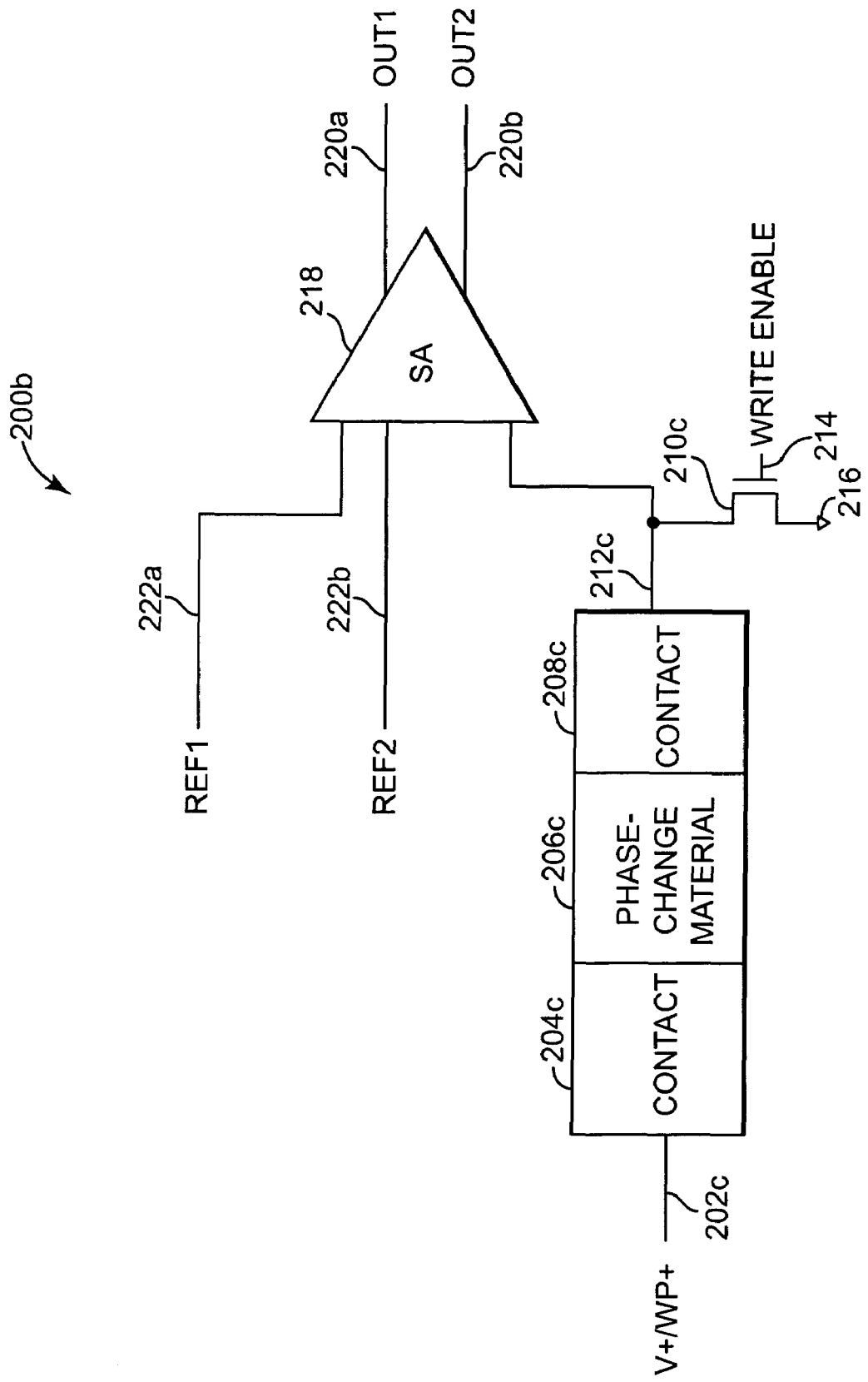
FIG. 7 illustrates another embodiment of a reprogrammable phase-change material switch.

FIG. 7 illustrates another embodiment of a reprogrammable phase-change material switch 200b. Reprogrammable phase-change material switch 200b is similar to reprogrammable phase-change material switch 200a except that contacts 204a-204b, contacts 208a-208b, phase-change material 206a-206b, and transistors 210a-210b are replaced by a first reference signal and a second reference signal.

The first input of sense amplifier 218 receives the first reference (REF1) signal on REF1 signal path 222a. The second input of sense amplifier 218 receives the second reference (REF2) signal on REF2 signal path 222b. The REF1 signal is a reference current. The REF2 signal is also a reference current and has a different value than the REF1 signal. Contact 204c receives a constant voltage (V+) or a write pulse (WP+) signal on V+/WP+ signal path 202c. Contact 204c is electrically coupled to phase-change material 206c. Phase-change material 206c is electrically coupled to contact 208c. Contact 208c is electrically coupled to a third input of sense amplifier 218 and one side of the source-drain path of transistor 210c through signal path 212c. The other side of the source-drain path of transistor 210c is electrically coupled to common or ground 216. The gate of transistor 210c receives the write enable signal on write enable signal path 214. Sense amplifier 218 provides the out one (OUT1) signal on OUT1 signal path 220a and the out two (OUT2) signal on OUT2 signal path 220b. Phase-change material 206c is programmed as previously described with reference to FIG. 6.

The constant current on REF1 signal path 222a provides a first fixed reference current to compare to the current through phase-change material 206c. The current on REF2 signal path 222b provides a second fixed reference current to compare to the current through phase-change material 206c. In one embodiment, the REF1 signal and the REF2 signal provide fixed references for more than one reprogrammable phase-change material switch 200b by using a suitable distribution circuit. In one embodiment, sense amplifier 218 is shared between several reprogrammable phase-change material switches 200b by using a suitable distribution circuit.

During operation of reprogrammable phase-change material switch 200b, the constant voltage V+ is selectively applied to contact 204c through V+/WP+ signal path 202c. With the constant voltage V+ applied to contact 204c, sense amplifier 218 compares the current on signal path 212c to the REF1 signal on REF1 signal path 222a and to the REF2 signal on REF2 signal path 222b. If phase-change material 206c has a resistance that provides a current on signal path 212c that is less than the REF1 signal, sense amplifier 218 outputs a high voltage level signal on OUT1 signal path 220a turning on a first portion of reprogrammable phase-change material switch 200b. If phase-change material 206c has a resistance that provides a current on signal path 212c that is greater than the REF1 signal, sense amplifier 218 outputs a low voltage level signal or ground signal on OUT1 signal path 220a turning off the first portion of reprogrammable phase-change material switch 200b. In another embodiment, the voltage levels output by sense amplifier 218 on OUT1 signal path 220a based on the state of phase-change material 206c and the REF1 signal are reversed.

If phase-change material 206c has a resistance that provides a current on signal path 212c that is less than the REF2 signal, sense amplifier 218 outputs a high voltage level signal on OUT2 signal path 220b turning on a second portion of reprogrammable phase-change material switch 200b. If phase-change material 206c has a resistance that provides a current on signal path 212c that is greater than the REF2 signal, sense amplifier 218 outputs a low voltage level signal or ground signal on OUT2 signal path 220b turning off the second portion of reprogrammable phase-change material switch 200b. In another embodiment, the voltage levels output by sense amplifier 218 on OUT2 signal path 220b based on the state of phase-change material 206c and the REF2 signal are reversed.

Figure 8:
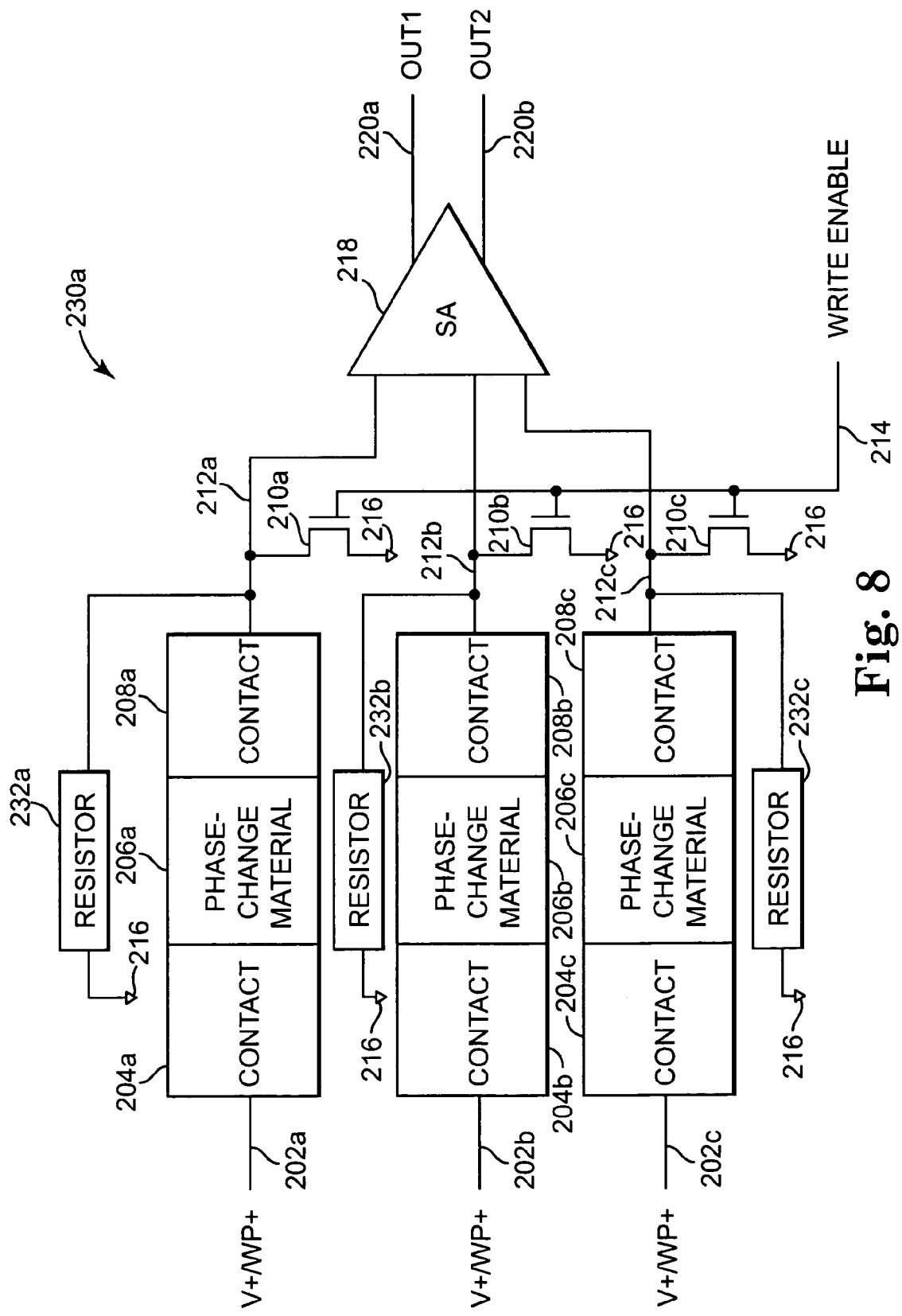
FIG. 8 illustrates another embodiment of a reprogrammable phase-change material switch.

FIG. 8 illustrates another embodiment of a reprogrammable phase-change material switch 230a. Reprogrammable phase-change material switch 230a includes contacts 204a-204c, contacts 208a-208c, first reference phase-change material 206a, second reference phase-change material 206b, phase-change material 206c, resistors 232a-232c, transistors 210a-210c, and sense amplifier (SA) 218. Reprogrammable phase-change material switch 230a controls two switch outputs based on the state of phase-change material 206a-206c. In one embodiment, the resistances of resistors 232a-232c are approximately equal. Reprogrammable phase-change material switch 230a can provide the following three switch output combinations: "off" and "off"; "on" and "off" or "off" and "on"; and "on" and "on". In other embodiments, more than two switch outputs can be controlled based on the state of phase-change material 206c. In another embodiment, a third reference phase-change material is provided, such that reprogrammable phase-change material switch 230a can provide the following four switch output combinations: "off" and "off"; "on" and "off"; "off" and "on"; and "on" and "on". In other embodiments, any suitable number of reference phase-change material elements and switch outputs are provided to obtain a desired number of switch outputs combinations.

Contact 204a receives a constant voltage (V+) or a write pulse (WP+) signal on V+/WP+ signal path 202a. Contact 204a is electrically coupled to first reference phase-change material 206a. First reference phase-change material 206a is electrically coupled to contact 208a. Contact 208a is electrically coupled to one side of resistor 232a, a first input of sense amplifier 218, and one side of the source-drain path of transistor 210a through signal path 212a. The other side of resistor 232a and the other side of the source-drain path of transistor 210a are electrically coupled to common or ground 216. The gate of transistor 210a receives the write enable signal on write enable signal path 214.

Contact 204b receives a constant voltage (V+) or a write pulse (WP+) signal on V+/WP+ signal path 202b. Contact 204b is electrically coupled to second reference phase-change material 206b. Second reference phase-change material 206b is electrically coupled to contact 208b. Contact 208b is electrically coupled to one side of resistor 232b, a second input of sense amplifier 218, and one side of the source-drain path of transistor 210b through signal path 212b. The other side of resistor 232b and the other side of the source-drain path of transistor 210b are electrically coupled to common or ground 216. The gate of transistor 210b receives the write enable signal on write enable signal path 214.

Contact 204c receives a constant voltage (V+) or a write pulse (WP+) signal on V+/WP+ signal path 202c. Contact 204c is electrically coupled to phase-change material 206c. Phase-change material 206c is electrically coupled to contact 208c. Contact 208c is electrically coupled to one side of resistor 232c, a third input of sense amplifier 218, and one side of the source-drain path of transistor 210c through signal path 212c. The other side of resistor 232c and the other side of the source-drain path of transistor 210c are electrically coupled to common or ground 216. The gate of transistor 210c receives the write enable signal on write enable signal path 214. Sense amplifier 218 provides an out one (OUT1) signal on OUT1 signal path 220a and an out two (OUT2) signal on OUT2 signal path 220b. In one embodiment, transistors 210a-210c and write enable signal path 214 are excluded. In another embodiment, transistors 210a-210c and write enable signal path 214 are replaced with a WP− signal path, such as WP− signal path 152 illustrated in FIG. 4. Phase-change material 206a-206c is programmed as previously described with reference to FIG. 6.

In one embodiment, first reference phase-change material 206a and second reference phase-change material 206b provide fixed references, such as reference phase-change element 110, to compare to phase-change material 206c. In one embodiment, first reference phase-change material 206a and second reference phase-change material 206b are programmed once at device fabrication. In one embodiment, first reference phase-change material 206a and second reference phase-change material 206b provide fixed references for more than one reprogrammable phase-change material switch 230a by using a suitable distribution circuit. In one embodiment, first reference phase-change material 206a is replaced by a static resistor and/or second reference phase-change material 206b is replaced by a static resistor. In one embodiment, sense amplifier 218 is shared between several reprogrammable phase-change material switches 230a by using a suitable distribution circuit.

During operation of reprogrammable phase-change material switch 230a, the constant voltage V+ is selectively applied to contact 204a through V+/WP+ signal path 202a, contact 204b through V+/WP+ signal path 202b, and contact 204c through V+/WP+ signal path 202c. With the constant voltage V+ supplied to contacts 204a, 204b, and 204c, a voltage divider is formed by phase-change material 206a and resistor 232a, by phase-change material 206b and resistor 232b, and by phase-change material 206c and resistor 232c. Sense amplifier 218 compares the voltage on signal path 212c to the voltage on signal path 212a and to the voltage on signal path 212b.

If phase-change material 206c has a resistance greater than the resistance of first reference phase-change material 206a, then the voltage drop across phase-change material 206c is greater than the voltage drop across first reference phase-change material 206a. Therefore, the voltage on signal path 212c is less than the voltage on signal path 212a. In response to the voltage on signal path 212c being less than the voltage on signal path 212a, sense amplifier 218 outputs a high voltage level signal on OUT1 signal path 220a turning on a first portion of reprogrammable phase-change material switch 230a.

If phase-change material 206c has a resistance less than the resistance of first reference phase-change material 206a, then the voltage drop across phase-change material 206c is less than the voltage drop across first reference phase-change material 206a. Therefore, the voltage on signal path 212c is greater than the voltage on signal path 212a. In response to the voltage on signal path 212c being greater than the voltage on signal path 212a, sense amplifier 218 outputs a low voltage level signal or ground signal on OUT1 signal path 220a turning off the first portion of reprogrammable phase-change material switch 230a. In another embodiment, the voltage levels output by sense amplifier 218 on OUT1 signal path 220a based on the states of phase-change material 206c and first reference phase-change material 206a are reversed.

If phase-change material 206c has a resistance greater than the resistance of second reference phase-change material 206b, then the voltage drop across phase-change material 206c is greater than the voltage drop across second reference phase-change material 206b. Therefore, the voltage on signal path 212c is less than the voltage on signal path 212b. In response to the voltage on signal path 212c being less than the voltage on signal path 212b, sense amplifier 218 outputs a high voltage level signal on OUT2 signal path 220b turning on a second portion of reprogrammable phase-change material switch 230a.

If phase-change material 206c has a resistance less than the resistance of second reference phase-change material 206b, then the voltage drop across phase-change material 206c is less than the voltage drop across second reference phase-change material 206b. Therefore, the voltage on signal path 212c is greater than the voltage on signal path 212b. In response to the voltage on signal path 212c being greater than the voltage on signal path 212b, sense amplifier 218 outputs a low voltage level signal or ground signal on OUT2 signal path 220b turning off the second portion of reprogrammable phase-change material switch 230a. In another embodiment, the voltage levels output by sense amplifier 218 on OUT2 signal path 220b based on the states of phase-change material 206c and second reference phase-change material 206b are reversed.

Figure 9:
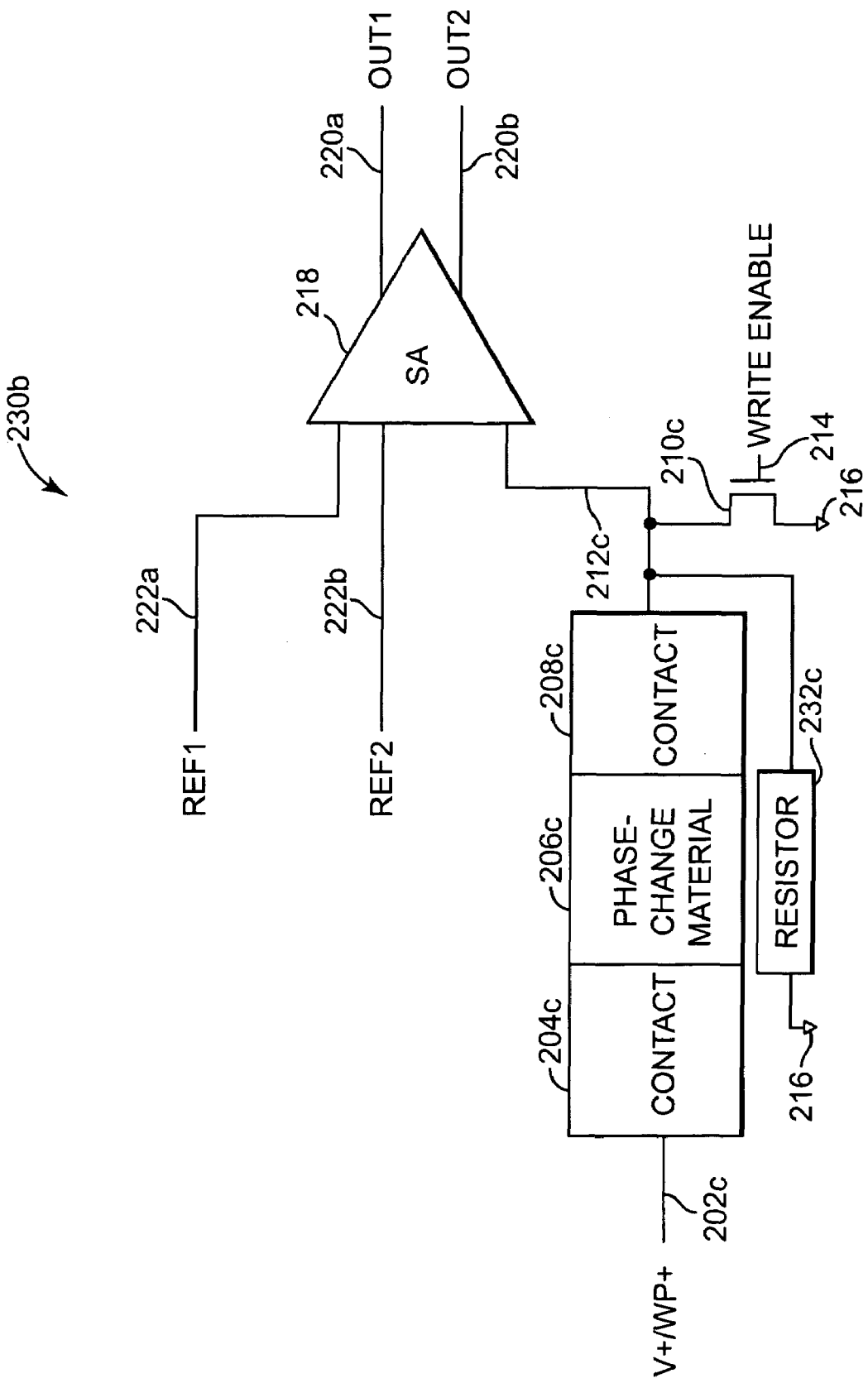
FIG. 9 illustrates another embodiment of a reprogrammable phase-change material switch.

FIG. 9 illustrates another embodiment of a reprogrammable phase-change material switch 230b. Reprogrammable phase-change material switch 230b is similar to reprogrammable phase-change material switch 230a except that contacts 204a-204b, contacts 208a-208b, phase-change material 206a-206b, and transistors 210a-210b are replaced by a first reference signal and a second reference signal.

The first input of sense amplifier 218 receives the first reference (REF1) signal on REF1 signal path 222a. The second input of sense amplifier 218 receives the second reference (REF2) signal on REF2 signal path 222b. The REF1 signal is a reference voltage. The REF2 signal is also a reference voltage and has a different value than the REF1 signal. Contact 204c receives a constant voltage (V+) or a write pulse (WP+) signal on V+/WP+ signal path 202c. Contact 204c is electrically coupled to phase-change material 206c. Phase-change material 206c is electrically coupled to contact 208c. Contact 208c is electrically coupled to one side of resistor 232c, a third input of sense amplifier 218, and one side of the source-drain path of transistor 210c through signal path 212c. The other side of resistor 232c and the other side of the source-drain path of transistor 210c are electrically coupled to common or ground 216. The gate of transistor 210c receives the write enable signal on write enable signal path 214. Sense amplifier 218 provides the out one (OUT1) signal on OUT1 signal path 220a and the out two (OUT2) signal on OUT2 signal path 220b. Phase-change material 206c is programmed as previously described with reference to FIG. 6.

The constant voltage on REF1 signal path 222a provides a first fixed reference voltage to compare to the voltage across phase-change material 206c. The voltage on REF2 signal path 222b provides a second fixed reference voltage to compare to the voltage across phase-change material 206c. In one embodiment, the REF1 signal and the REF2 signal provide fixed references for more than one reprogrammable phase-change material switch 200b by using a suitable distribution circuit. In one embodiment, sense amplifier 218 is shared between several reprogrammable phase-change material switches 230b by using a suitable distribution circuit.

During operation of reprogrammable phase-change material switch 230b, the constant voltage V+ is selectively applied to contact 204c through V+/WP+ signal path 202c. With the constant voltage V+ applied to contact 204c, a voltage divider is formed by phase-change material 206c and resistor 232c. Sense amplifier 218 compares the voltage on signal path 212c to the REF1 signal on REF1 signal path 222a and to the REF2 signal on REF2 signal path 222b. If phase-change material 206c has a resistance that provides a voltage on signal path 212c that is less than the REF1 signal, sense amplifier 218 outputs a high voltage level signal on OUT1 signal path 220a turning on a first portion of reprogrammable phase-change material switch 230b. If phase-change material 206c has a resistance that provides a voltage on signal path 212c that is greater than the REF1 signal, sense amplifier 218 outputs a low voltage level signal or ground signal on OUT1 signal path 220a turning off the first portion of reprogrammable phase-change material switch 230b. In another embodiment, the voltage levels output by sense amplifier 218 on OUT1 signal path 220a based on the state of phase-change material 206c and the REF1 signal are reversed.

If phase-change material 206c has a resistance that provides a voltage on signal path 212c that is less than the REF2 signal, sense amplifier 218 outputs a high voltage level signal on OUT2 signal path 220b turning on a second portion of reprogrammable phase-change material switch 230b. If phase-change material 206c has a resistance that provides a voltage on signal path 212c that is greater than the REF2 signal, sense amplifier 218 outputs a low voltage level signal or ground signal on OUT2 signal path 220b turning off the second portion of reprogrammable phase-change material switch 230b. In another embodiment, the voltage levels output by sense amplifier 218 on OUT2 signal path 220b based on the state of phase-change material 206c and the REF2 signal are reversed.

Figure 10:
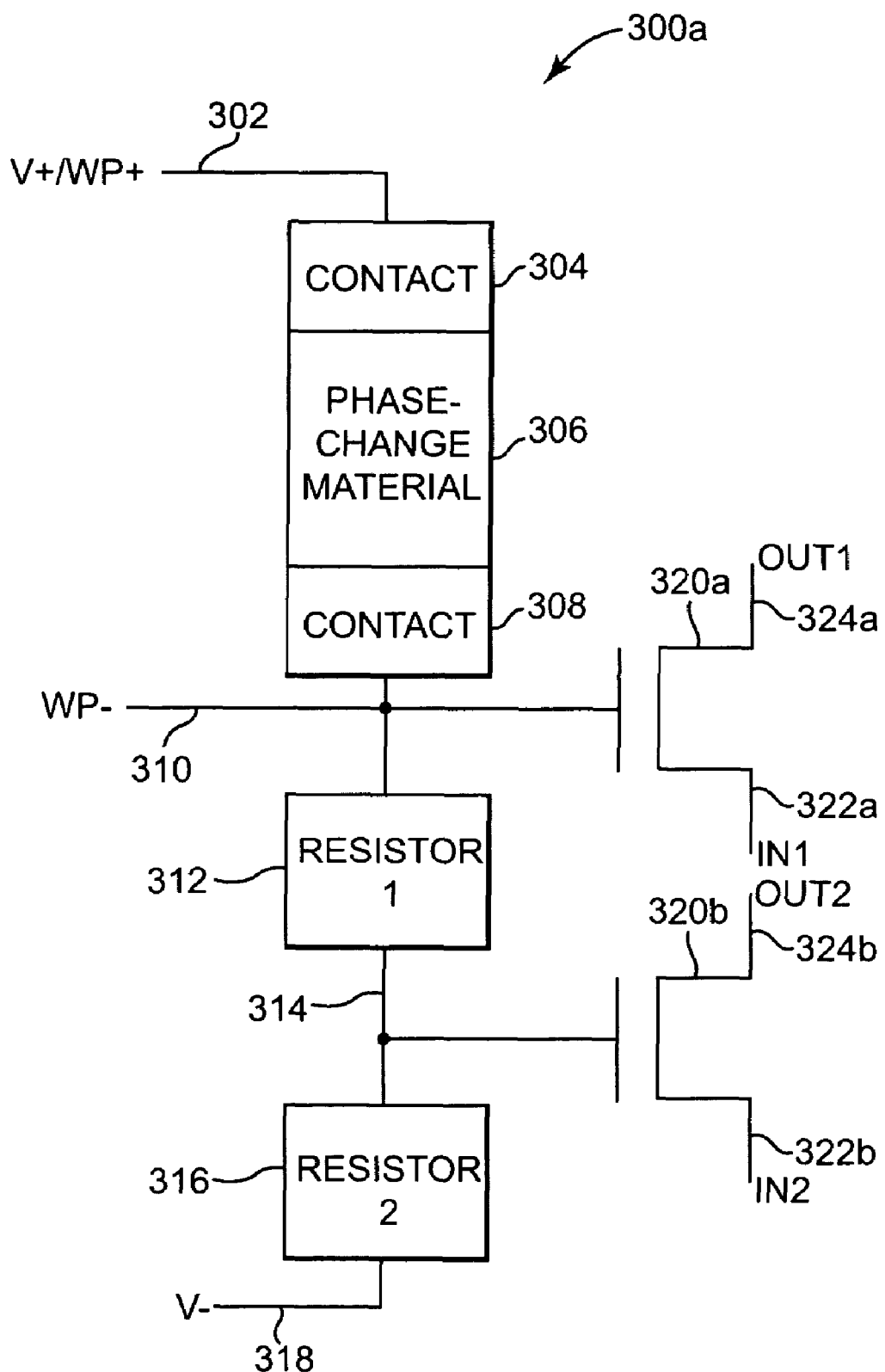
FIG. 10 illustrates another embodiment of a reprogrammable phase-change material switch.

FIG. 10 illustrates another embodiment of a reprogrammable phase-change material switch 300a. Reprogrammable phase-change material switch 300a includes contacts 304 and 308, phase-change material 306, resistor one 312, resistor two 316, and transistors 320a and 320b. Contact 304 receives a constant voltage (V+) or one side of a write pulse (WP+) signal on V+/WP+ signal path 302. Contact 304 is electrically coupled to phase-change material 306. Phase-change material 306 is electrically coupled to contact 308. Contact 308 is electrically coupled to one side of resistor one 312 and the gate of transistor 320a through the other side of the write pulse (WP−) signal path 310. One side of the source-drain path of transistor 320a receives a first input (IN1) signal on IN1 signal path 322a. The other side of the source-drain path of transistor 320a provides a first output (OUT1) signal on OUT1 signal path 324a.

The other side of resistor one 312 is electrically coupled to one side of resistor two 316 and the gate of transistor 320b through signal path 314. One side of the source-drain path of transistor 320b receives a second input (IN2) signal on IN2 signal path 322b. The other side of the source-drain path of transistor 320b provides a second output (OUT2) signal on OUT2 signal path 324b. The other side of resistor two 316 is selectively electrically coupled to a constant voltage (V−) through signal path 318. Constant voltage V− is less than constant voltage V+. In one embodiment, transistors 320a and 320b are metal-oxide-semiconductor field effect transistors (MOSFETs) or other suitable transistors.

During programming of phase-change material 306 of reprogrammable phase-change material switch 300a, write pulse generator 102 is selectively coupled across first contact 304 and second contact 308. Write pulse generator 102 controls the application of a current and/or voltage write pulse from first contact 304 through V+/WP+ signal path 302 to second contact 308 through WP− signal path 310, and thus to phase-change material 306, to program phase-change material 306.

During a set operation of phase-change material 306, a set current and/or voltage pulse is selectively enabled by write pulse generator 102 and sent through first contact 304 to phase-change material 306 thereby heating phase-change material 306 above its crystallization temperature (but usually below its melting temperature). In this way, phase-change material 306 reaches its crystalline state or a partially crystalline and partially amorphous state during this set operation.

During a reset operation of phase-change material 306, a reset current and/or voltage pulse is selectively enabled by write pulse generator 102 and sent through first contact 304 to phase-change material 306. The reset current or voltage quickly heats phase-change material 306 above its melting temperature. After the current and/or voltage pulse is turned off, phase-change material 306 quickly quench cools into the amorphous state or a partially amorphous and partially crystalline state. Phase-change material 306 can be programmed to one of three or more resistance values.

During operation of reprogrammable switch 300a, the constant voltage V+ is selectively applied to contact 304 through V+/WP+ signal path 302 and the constant voltage V− is selectively applied to resistor two 316 through signal path 318. With the constant voltage V+ applied to contact 304 and the constant voltage V− applied to resistor two 316, a voltage divider is formed by phase-change material 306 and resistor one 312 and resistor two 316, which are reference elements. The voltage on signal path 310 is defined by the following equation:

$$V_{310} = [(V+) - (V-)]\left[\frac{R_1 + R_2}{R_1 + R_2 + R_{PCM}}\right] \quad \text{Equation I}$$

Where:
$V_{310}$=voltage on signal path 310;
$R_1$=resistance of resistor one 312;
$R_2$=resistance of resistor two 316; and
$R_{PCM}$=resistance of phase change material 306.

If the voltage on signal path 310 exceeds the turn on threshold voltage of transistor 320a, transistor 320a turns on to pass signals from IN1 signal path 322a to OUT1 signal path 324a. If the voltage on signal path 310 does not exceed the turn on threshold voltage of transistor 320a, transistor 320a turns off to block signals from IN1 signal path 322a from passing to OUT1 signal path 324a.

The voltage on signal path 314 is given by the following equation:

$$V_{314} = [(V+) - (V-)]\left[\frac{R_2}{R_1 + R_2 + R_{PCM}}\right] \quad \text{Equation II}$$

Where:
$V_{314}$=voltage on signal path 314;
$R_1$=resistance of resistor one 312;
$R_2$=resistance of resistor two 316; and
$R_{PCM}$=resistance of phase change material 306.

If the voltage on signal path 314 exceeds the turn on threshold voltage of transistor 320b, transistor 320b turns on to pass signals from IN2 signal path 322b to OUT2 signal path 324b. If the voltage on signal path 314 does not exceed the turn on threshold voltage of transistor 320b, transistor 320b turns off to block signals from IN2 signal path 322b from passing to OUT2 signal path 324b.

Figure 11:
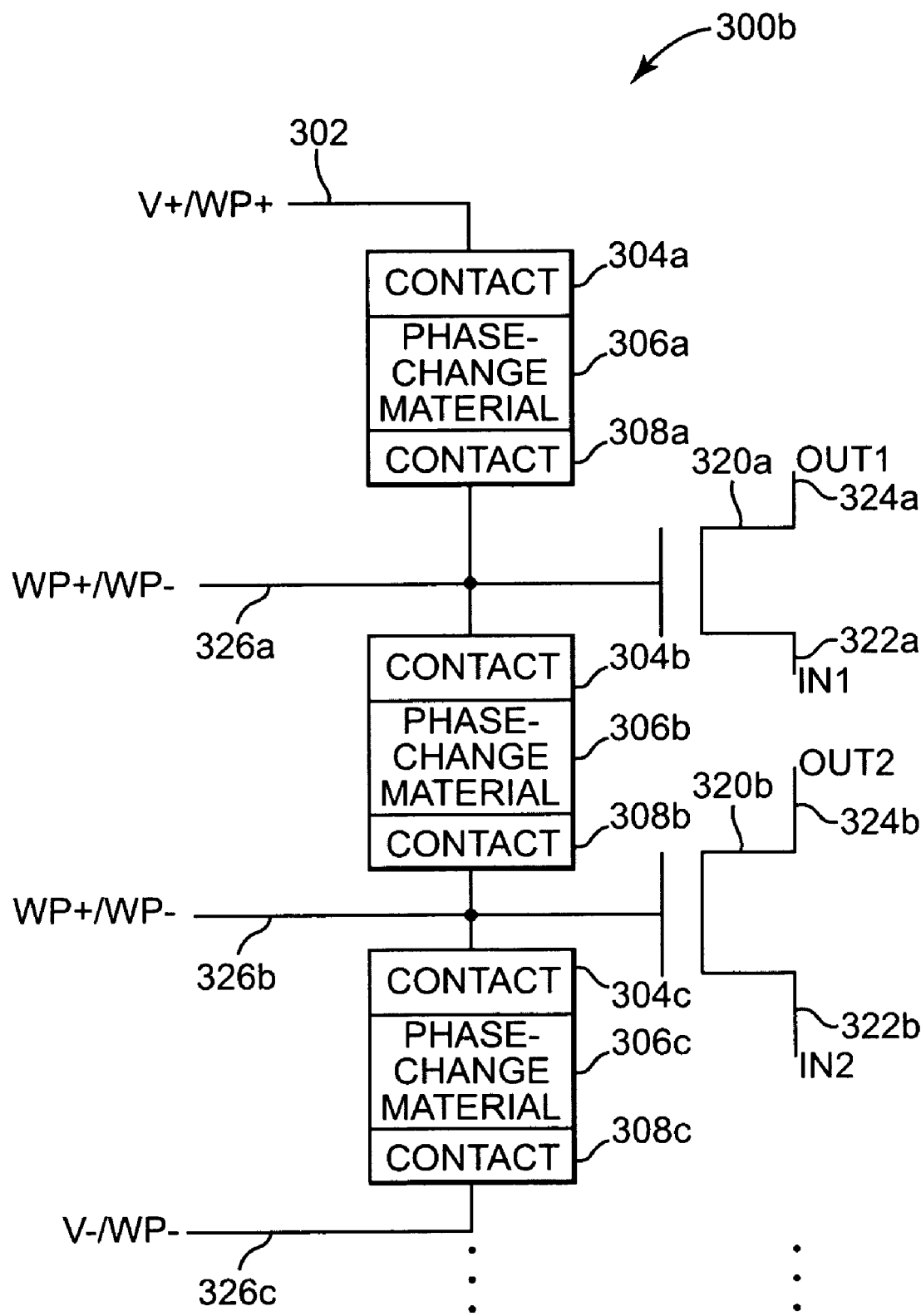
FIG. 11 illustrates another embodiment of a reprogrammable phase-change material switch.

FIG. 11 illustrates another embodiment of a reprogrammable phase-change material switch 300b. Reprogrammable phase-change material switch 300b is similar to reprogrammable phase-change material switch 300a except that resistor one 312 and resistor two 316 are replaced with phase-change material. Contact 304a receives the V+/WP+ signal on V+/WP+ signal path 302. Contact 304a is electrically coupled to phase-change material 306a. Phase-change material 306a is electrically coupled to contact 308a. Contact 308a is electrically coupled to contact 304b and the gate of transistor 320a through WP+/WP− signal path 326a. One side of the source-drain path of transistor 320a receives a first input (IN1) signal on IN1 signal path 322a. The other side of the source-drain path of transistor 320a provides a first output (OUT1) signal on OUT1 signal path 324a.

Contact 304b is electrically coupled to phase-change material 306b. Phase-change material 306b is electrically coupled to contact 308b. Contact 308b is electrically coupled to contact 304c and the gate of transistor 320b through WP+/WP− signal path 326b. One side of the source-drain path of transistor 320b receives a second input (IN2) signal on IN2 signal path 322b. The other side of the source-drain path of transistor 320b provides a second output (OUT2) signal on OUT2 signal path 324b.

Contact 304c is electrically coupled to phase-change material 306c. Phase-change material 306c is electrically coupled to contact 308c. Contact 308c receives a constant voltage (V−) or the other side of the write pulse (WP−) signal on V−/WP− signal path 326c. The constant voltage V− is less than the constant voltage V+. In other embodiments, a suitable number of additional phase-change material elements and transistors can be coupled to contact 308c. Phase-change material 306a-306c is programmed similarly to phase-change material 306 previously described with reference to FIG. 10.

During operation of reprogrammable switch 300b, the constant voltage V+ is selectively applied to contact 304a through V+/WP+ signal path 302 and the constant voltage V− is selectively applied to contact 308c through V−/WP− signal path 326c. With the constant voltage V+ applied to contact 304a and the constant voltage V− applied to contact 308c, a voltage divider is formed by phase-change material 306a, phase-change material 306b, and phase-change material 306c. The voltage on signal path 326a is given by the following equation:

$$V_{326a} = [(V+) - (V-)]\left[\frac{R_{306b} + R_{306c}}{R_{306a} + R_{306b} + R_{306c}}\right] \quad \text{Equation III}$$

Where:
$V_{326a}$=voltage on signal path 326a;
$R_{306a}$=resistance of phase change material 306a;
$R_{306b}$=resistance of phase change material 306b; and
$R_{306c}$=resistance of phase change material 306c.

If the voltage on signal path 326a exceeds the turn on threshold voltage of transistor 320a, transistor 320a turns on to pass signals from IN1 signal path 322a to OUT1 signal path 324a. If the voltage on signal path 326a does not exceed the turn on threshold voltage of transistor 320a, transistor 320a turns off to block signals from IN1 signal path 322a from passing to OUT1 signal path 324a.

The voltage on signal path 326b is given by the following equation:

$$V_{326b} = [(V+) - (V-)]\left[\frac{R_{306c}}{R_{306a} + R_{306b} + R_{306c}}\right] \quad \text{Equation IV}$$

Where:

$V_{326b}$=voltage on signal path 326b;
$R_{306a}$=resistance of phase change material 306a;
$R_{306b}$=resistance of phase change material 306b; and
$R_{306c}$=resistance of phase change material 306c.

If the voltage on signal path 326b exceeds the turn on threshold voltage of transistor 320b, transistor 320b turns on to pass signals from IN2 signal path 322b to OUT2 signal path 324b. If the voltage on signal path 326b does not exceed the turn on threshold voltage of transistor 320b, transistor 320b turns off to block signals from IN2 signal path 322b from passing to OUT2 signal path 324b.

Embodiments of the present invention provide a reprogrammable switch, which can also be used as a fuse or antifuse using phase-change material. The resistivity of the phase-change material determines whether the switch is on or off or if used as a fuse or antifuse, whether the fuse or antifuse is open or closed. The switches are reprogrammable and use a small amount of space on a semiconductor chip compared to laser fuses and e-fuses. In addition, for phase-change memories, the reprogrammable switches can be fabricated simultaneously with the memory cells further reducing the cost.

What is claimed is:

1. An integrated circuit having a switch comprising:
  a first resistivity changing element;
  a first reference element;
  a second reference element; and
  a sense amplifier, the sense amplifier configured to compare a signal from the first resistivity changing element to a signal from the first reference element and to output a first signal based on the comparison for configuring the integrated circuit, the sense amplifier further configured to compare the signal from the first resistivity changing element to a signal from the second reference element and to output a second signal based on the comparison for configuring the integrated circuit.

2. The integrated circuit of claim 1, wherein the first reference element comprises a second resistivity changing element.

3. The integrated circuit of claim 2, wherein the second reference element comprises a third resistivity changing element.

4. The integrated circuit of claim 1, wherein the first reference element comprises a first resistor.

5. The integrated circuit of claim 4, wherein the second reference element comprises a second resistor.

6. The integrated circuit of claim 1, wherein the first resistivity changing element can be programmed to each one of at least three resistance values.

7. The integrated circuit of claim 1, further comprising:
  a third reference element,
  wherein the sense amplifier is further configured to compare the signal from the first resistivity changing element to a signal from the third reference element and to output a third signal based on the comparison for configuring the integrated circuit.

8. A reprogrammable switch comprising:
  phase-change material; and
  a sense amplifier coupled to the phase-change material, a first reference signal, and a second reference signal, the sense amplifier configured to compare a signal from the phase-change material to the first reference signal to provide a first output signal for deactivating a failing portion of a chip, the sense amplifier further configured to compare the signal from the phase-change material to the second reference signal to provide a second output signal for deactivating a failing portion of the chip.

9. The switch of claim 8, wherein the first reference signal comprises a first voltage, the second reference signal comprises a second voltage, and the signal from the phase-change material comprises a third voltage.

10. The switch of claim 8, wherein the first reference signal comprises a first current, the second reference signal comprises a second current, and the signal from the phase-change material comprises a third current.

11. A reprogrammable switch comprising:
  a first phase-change element;
  a first reference element directly coupled to the first phase-change element;
  a second reference element directly coupled to the first reference element;
  a first transistor directly coupled to the first phase-change element and the first reference element, the first transistor turning on based on a state of the first phase-change element; and
  a second transistor directly coupled to the first reference element and the second reference element, the second transistor turning on based on a state of the first phase-change element.

12. The switch of claim 11, wherein the first reference element comprises a second phase-change element, and
  wherein the first transistor turns on based on a state of the first phase-change element and a state of the second phase-change element.

13. The switch of claim 12, wherein the second reference element comprises a third phase-change element, and
  wherein the second transistor turns on based on a state of the first phase-change element and a state of the third phase-change element.

14. The switch of claim 11, wherein the first reference element comprises a first resistor.

15. The switch of claim 14, wherein the second reference element comprises a second resistor.

16. The switch of claim 11, wherein the first phase-change element can be programmed to each one of at least three resistance values.

17. The switch of claim 11, further comprising:
  a third reference element coupled to the second reference element; and
  a third transistor coupled to the second reference element and the third reference element, the third transistor turning on based on a state of the first phase-change element.

18. A reprogrammable switch comprising:
  phase-change material;
  a first reference element;
  a second reference element; and
  means for deactivating a first failing portion of an integrated circuit based on a state of the first reference element and a state of the phase-change material and for deactivating a second failing portion of the integrated circuit based on a state of the second reference element and the state of the phase-change material.

19. The switch of claim 18, wherein the phase-change material can be programmed to each one of at least three resistance values.

20. The switch of claim 18, wherein the phase-change material comprises one of Ge, Sb, Te, Ga, As, In, Se, and S.

21. A method for using a reprogrammable switch, the method comprising:
  applying a write pulse to a first phase-change material to switch a state of the first phase-change material;
  applying a first signal to the first phase-change material, a first reference element, and a second reference element;

sensing a second signal from the first phase-change material, a third signal from the first reference element, and a fourth signal from the second reference element;
comparing the second signal to the third signal to provide a fifth signal;
configuring an integrated circuit based on the fifth signal;
comparing the second signal to the fourth signal to provide a sixth signal; and
configuring the integrated circuit based on the sixth signal.

22. The method of claim 21, wherein applying the first signal to the first reference element comprises applying the first signal to second phase-change material.

23. The method of claim 21, wherein applying the first signal to the first reference element comprises applying the first signal to a resistor.

24. A method for using a reprogrammable switch, the method comprising:
applying a write pulse to first phase-change material to program the first phase-change material;
dividing a first voltage between the first phase-change material, a first reference element, and a second reference element to provide a second voltage and a third voltage;
turning on a first switch based on the second voltage;
configuring an integrated circuit with the first switch;
turning on a second switch based on the third voltage; and
configuring the integrated circuit with the second switch.

25. The method of claim 24, wherein dividing the first voltage comprises dividing the first voltage between the first phase-change material, the first reference element comprising a first static resistor, and the third reference element comprising a second static resistor.

26. The method of claim 24, wherein dividing the first voltage comprises dividing the first voltage between the first phase-change material, the first reference element comprising a second phase-change material, and the third reference element comprising a third phase-change material.

27. The method of claim 24, wherein turning on the first switch comprises turning on a first transistor switch, and
wherein turning on the second switch comprises turning on a second transistor switch.

28. An integrated circuit comprising:
a resistivity changing element;
a reference element; and
a sense amplifier continuously electrically coupled to the resistivity changing element and continuously providing an output signal based on a state of the resistivity changing element and a state of the reference element for deactivating a failing portion of the integrated circuit.

* * * * *